US010390421B2

(12) United States Patent
Silvano De Sousa (10) Patent No.: US 10,390,421 B2
(45) Date of Patent: Aug. 20, 2019

(54) ELECTRONIC COMPONENT CARRIER FOR CARRYING AND COOLING A HEAT GENERATING ELECTRONIC COMPONENT

(71) Applicant: AT & S Austria Technologie & Systemtechnik Aktiengesellshaft, Leoben (AT)

(72) Inventor: Jonathan Silvano De Sousa, Vienna (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/765,017

(22) PCT Filed: Sep. 30, 2016

(86) PCT No.: PCT/EP2016/073500
§ 371 (c)(1),
(2) Date: Mar. 30, 2018

(87) PCT Pub. No.: WO2017/055599
PCT Pub. Date: Apr. 6, 2017

(65) Prior Publication Data
US 2018/0288866 A1    Oct. 4, 2018

(30) Foreign Application Priority Data
Oct. 1, 2015   (DE) ................. 10 2015 116 666

(51) Int. Cl.
*H05K 1/02* (2006.01)
*H05K 1/11* (2006.01)
*H05K 1/18* (2006.01)

(52) U.S. Cl.
CPC ......... *H05K 1/0206* (2013.01); *H05K 1/0207* (2013.01); *H05K 1/0274* (2013.01);
(Continued)

(58) Field of Classification Search
CPC ..... H05K 2201/026; H05K 2201/0112; H05K 1/181
See application file for complete search history.

(56) References Cited

U.S. PATENT DOCUMENTS 3,953,110 A * 4/1976 Charoudi ............... F24S 80/52
359/227
4,085,999 A * 4/1978 Chahroudi ............. F24S 50/80
359/358

(Continued)

FOREIGN PATENT DOCUMENTS

CN     201774738 U    3/2011
CN     203474703 U    3/2014
(Continued)

OTHER PUBLICATIONS

Aktar Ltd., Ultra-Absorbing Black Coating, Photonics.com, Aug. 2012, 1 pp. (downloaded Aug. 7, 2014 at http://www.photonics.com/Product.aspx?PRID=51571.
(Continued)

*Primary Examiner* — David M Sinclair
*Assistant Examiner* — Robert D Brown
(74) *Attorney, Agent, or Firm* — Robert A. Blaha; Smith Tempel Blaha LLC (57) ABSTRACT

A component carrier for carrying and cooling at least one heat generating electronic component is presented. The component carrier comprising includes an outer layer structure, an electrically insulating layer arranged adjacent to the outer layer structure, and a heat conducting structure arranged adjacent to the electrically insulating layer on a side opposite to the outer layer structure. The heat conducting structure is thermally coupled to the at least one heat generating electronic component such that the outer layer structure receives thermal radiation irradiated by the heat conducting structure and transports corresponding heat
(Continued)

away from the component carrier via convection by a heat transfer medium surrounding the component carrier.

20 Claims, 4 Drawing Sheets

(52) U.S. Cl.
CPC ............. *H05K 1/115* (2013.01); *H05K 1/181* (2013.01); *H05K 1/185* (2013.01); *H05K 2201/0112* (2013.01); *H05K 2201/026* (2013.01); *H05K 2201/0317* (2013.01); *H05K 2201/0323* (2013.01); *H05K 2201/10416* (2013.01); *H05K 2201/2054* (2013.01)

(56) References Cited

U.S. PATENT DOCUMENTS

| | | | | |
|---|---|---|---|---|
| 6,936,769 | B1* | 8/2005 | Noguchi | H01L 23/3677 174/260 |
| 7,928,358 | B2* | 4/2011 | Yamamiya | H01L 27/14618 250/239 |
| 2002/0047193 | A1* | 4/2002 | Dorfler | H01L 23/367 257/687 |
| 2004/0146707 | A1* | 7/2004 | Machida | H01L 23/3735 428/328 |
| 2004/0147656 | A1* | 7/2004 | Machida | C08K 3/22 524/430 |
| 2009/0087639 | A1* | 4/2009 | Li | H05K 7/20963 428/304.4 |
| 2009/0109624 | A1* | 4/2009 | Chan | H05K 1/0206 361/702 |
| 2009/0283299 | A1* | 11/2009 | Suzuki | H05K 1/0207 174/251 |
| 2009/0296349 | A1* | 12/2009 | Suzuki | H05K 1/0206 361/705 |
| 2010/0112316 | A1* | 5/2010 | Cincotti | F41H 3/02 428/201 |
| 2011/0114630 | A1 | 5/2011 | Yabe | |
| 2014/0042479 | A1* | 2/2014 | Margalit | H01L 33/10 257/98 |
| 2014/0102686 | A1 | 4/2014 | Yu et al. | |
| 2014/0125506 | A1* | 5/2014 | Sjolund | F41H 3/00 342/3 |
| 2014/0355215 | A1* | 12/2014 | Canete | H05K 3/30 361/720 |
| 2015/0097906 | A1* | 4/2015 | Beier | B41J 11/002 347/103 |
| 2015/0198423 | A1* | 7/2015 | Sjolund | B60N 2/5678 136/204 |
| 2015/0208550 | A1* | 7/2015 | Rugg | H05K 7/20518 361/713 |
| 2016/0135330 | A1* | 5/2016 | Sjolund | G05D 23/1917 700/300 |
| 2017/0079130 | A1* | 3/2017 | Schulz | H05K 1/0206 |

FOREIGN PATENT DOCUMENTS

| | | |
|---|---|---|
| EP | 2 009 968 A1 | 12/2008 |
| JP | 2013004708 A | 1/2013 |

OTHER PUBLICATIONS

AkzoNobel, Infrared Reflective Coatings—Low Observable Technology, 2009.
N. Ahmad et al., Ultra-Thin metal Films for Enhanced Solar Absorption, 8 pp., date of publication and publisher unknown.
BASF, Paint It Cool! Solar Heat Managment in Paints and Coatings, 3 pp. (downloaded Jul. 17, 2014 at http://www.dispersions-pigments.basf.com/portal/basf/ien/dt.isp?setCursor=1 559806).
Kumar, V. Dinesh, et al., Analysys of 90 Degree Bend in Hexagonal Photonic Bandgap Structures, 7 pp., Department of Electrical Communication Engineering, Indian Institute of Science, Bangalore, 560012, India, date of publication unknown.
Dobson, K.D., et al. Thin Semiconductor Films for Radiative Cooling Applications, Solar Energy Materials & Solar Cells 80, 2003, pp. 283-296.
Kats, Mikhail A., et al., Vanadium Dioxide as a Natural Disordered MetaMaterial: Perfect Thermal Emission and Large Broadband Negative Differential thermal Emittance, 7pp, Oct. 21, 2013, School of Engineering and Applied Sciences, Harvard University, Cambridge, Massachusetts 02138, U.S.A.

\* cited by examiner

ELECTRONIC COMPONENT CARRIER FOR CARRYING AND COOLING A HEAT GENERATING ELECTRONIC COMPONENT

CROSS-REFERENCE TO RELATED APPLICATIONS

This application is a US national phase application of international patent application PCT/EP2016/073500, filed on Sep. 30, 2016, which designated the U.S. and claims the benefit of the filing date of German Patent Application No. 10 2015 116 666.6, filed on Oct. 1, 2015, the disclosures of which are hereby incorporated herein by reference in their entirety.

TECHNICAL FIELD

The invention relates to an electronic component carrier, an electronic device, and a method of manufacturing an electronic device.

TECHNOLOGICAL BACKGROUND

Electronic components produce heat during operation and therefore some kind of cooling may be necessary in order to maintain appropriate operation temperature and to protect against breakdown and damage. Usually, the electronic components are mounted on or packaged in an electronic component carrier and cooling is provided by various additional heat transporting features, such as a cooling fin and/or a blower. With continuous demand for small form factors and improved performance at lower costs, there is still room for improved cooling solutions.

SUMMARY

There may be a need to enable efficient cooling of electronic components in a simple and compact manner.

A component carrier, an electronic device, and a method of manufacturing an electronic device according to the independent claims are provided.

According to a first aspect of the invention, a component carrier for carrying and cooling at least one heat generating electronic component is provided. The component carrier comprises (a) an outer layer structure, (b) an electrically insulating layer arranged adjacent to the outer layer structure, and (c) a heat conducting structure arranged adjacent to the electrically insulating layer on a side opposite to the outer layer structure, the heat conducting structure being adapted to be thermally coupled to the at least one heat generating electronic component. The outer layer structure is adapted to receive thermal radiation irradiated by the heat conducting structure and to transport corresponding heat away from the component carrier via convection by a heat transfer medium surrounding the component carrier.

This aspect of the invention is based on the idea that the heat conducting structure is coupled to receive heat from the at least one heat generating electronic component (during operation). Corresponding thermal energy is irradiated as thermal radiation by the heat conducting structure towards the outer layer structure, which receives the energy and transports it away as heat via convection. Thereby, an effective cooling of the at least one heat generating electronic component is provided by the component carrier.

In the context of the present application, the term "component carrier" may particularly denote any support structure which is capable of accommodating one or more electronic components thereon and/or therein for providing both mechanical support and electrical connectivity.

In the context of the present application, the term "outer layer structure" may particularly denote a layered structure forming an outer part, such as an outer surface, of the component carrier.

In the context of the present application, the term "heat conducting structure" may particularly denote a structure, such as a layered structure, comprising a material capable of conducting heat and of irradiating thermal radiation, i.e. electromagnetic radiation.

In other words, the outer layer structure, the electrically insulating layer and the heat conducting structure essentially form a layered structure where the electrically insulating layer is arranged between the outer layer structure and the heat conducting structure. The heat conducting structure is capable of being thermally coupled to the at least one electronic component to receive heat from the electronic component, e.g. via electrodes of the electronic component. Once the temperature of the heat conducting structure increases, it irradiates thermal radiation which propagates through the electrically insulating layer and impinges onto the outer layer structure. The outer layer structure receives the thermal radiation and transports corresponding heat away from the component carrier using convection, e.g. via surrounding air.

Summarizing, the component carrier is capable of providing excellent cooling of an electronic component in a simple, compact and relatively cheap package.

Overview of Embodiments

According to an exemplary embodiment of the invention, the outer layer structure comprises a first layer arranged adjacent to the electrically insulating layer.

In other words, the first layer constitutes an inner layer of the outer layer structure in the sense that it receives the thermal radiation irradiated by the heat conducting structure.

According to a further exemplary embodiment of the invention, the first layer is adapted to absorb thermal radiation.

According to a further exemplary embodiment of the invention, the first layer comprises an infrared light absorbing material.

According to a further exemplary embodiment of the invention, the infrared light absorbing material is an infrared light absorbing film or coating, in particular a carbon nanotube/nanodiamond based thin film coating or an ultra-absorbing black coating.

According to a further exemplary embodiment of the invention, the first layer is adapted to deflect thermal radiation irradiated by the heat conducting structure in a predetermined direction, preferably a direction parallel to the outer layer structure.

According to a further exemplary embodiment of the invention, the first layer comprises a waveguide structure adapted to guide the deflected thermal radiation away from the outer layer structure.

In particular, the waveguide may be formed by photonic crystals in such a way that it deflects incoming thermal radiation (e.g. tangentially to the surface of the outer layer structure) and guides the thermal radiation away from the structure.

According to a further exemplary embodiment of the invention, the outer layer structure is further adapted to prevent external thermal radiation impinging onto the outer layer structure from propagating through the outer layer structure.

In the context of the present application, the term "external thermal radiation" may particularly denote thermal radiation originating from one or more sources external to the component carrier, such as sunlight, electric light, IR (infrared light) originating from the surrounding air, etc.

In other words, the outer layer structure also prevents external thermal radiation impinging on the outer layer structure from propagating through the outer layer structure such that substantially no additional heat is received through the outer layer structure.

Thereby, the outer layer structure prevents additional heat from entering the component carrier (in particular the heat conducting structure) which would be detrimental to the cooling function of the component carrier.

According to a further exemplary embodiment of the invention, the outer layer structure further comprises a second layer adapted to prevent thermal radiation from propagating through the outer layer structure.

Thus, while the first layer (as mentioned above) constitutes an inner layer of the outer layer structure, the second layer constitutes an outer layer of the outer layer structure in the sense that it is arranged to be exposed to external thermal radiation and prevent it from propagating through the outer layer structure.

According to a further exemplary embodiment of the invention, the second layer is adapted to reflect thermal radiation.

According to a further exemplary embodiment of the invention, the second layer comprises an infrared light reflecting material.

According to a further exemplary embodiment of the invention, the infrared light reflecting material is selected from the group consisting of Paliogen Black L 0086, Sicopal Black L 0095, Xfast Black 0095, Luconyl NG Black 0095, a semiconductor film comprising PbS, and a semiconductor film comprising PbSe.

These materials exhibit excellent reflection of infrared light.

According to a further exemplary embodiment of the invention, the second layer is adapted to deflect external thermal radiation impinging onto the outer layer structure in a predetermined direction.

According to a further exemplary embodiment of the invention, the second layer comprises a waveguide structure adapted to guide the deflected thermal radiation away from the outer layer structure.

In particular, the waveguide may be formed by photonic crystals in such a way that it deflects incoming thermal radiation (e.g. tangentially to the surface of the outer layer structure) and guides the thermal radiation away from the structure.

In embodiments where both the first and second layer comprises a waveguide structure, a single waveguide structure may be used for both layers or each layer may comprise its own separate waveguide structure.

According to a further exemplary embodiment of the invention, the electrically insulating layer comprises an electrically and thermally insulating material which is substantially transparent to thermal radiation, in particular transparent to infrared light.

Examples of such electrically and thermally insulating materials include a material selected from the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide.

According to a further exemplary embodiment of the invention, the heat conducting structure comprises a material having an emissivity equal to or larger than 0.7 at room temperature, such as equal to or larger than 0.75, such as equal to or larger than 0.80, such as equal to or larger than 0.85, such as equal to or larger than 0.90, such as equal to or larger than 0.95.

In the context of the present application, the term "emissivity" denotes the efficiency with which the body emits electromagnetic radiation. The emissivity is usually labeled $\varepsilon$ and is between zero (no emission of thermal radiation) and one (optimal emission of thermal radiation), i.e. $0 \leq \varepsilon \leq 1$.

According to a further exemplary embodiment of the invention, the heat conducting structure comprises a material selected from the group consisting of cuprous oxide, rough copper, and vanadium dioxide.

These exemplary materials exhibit excellent emissivity above 0.7 at room temperature.

According to a further exemplary embodiment of the invention, the component carrier further comprises (a) a further electrically insulating layer arranged on a side of the heat conducting structure opposite to the electrically insulating layer, and (b) a further outer layer structure arranged adjacent the further electrically insulating layer on a side opposite to the heat conducting structure. The further outer layer structure is adapted to receive thermal radiation irradiated by the heat conducting structure and to transport corresponding heat away from the component carrier via convection by a heat transfer medium surrounding the component carrier.

In other words, the further outer layer structure constitutes a further outer part or surface of the component carrier on the other side of the heat conducting structure, i.e. on the side of the heat conducting structure that is opposite to the outer layer structure. The further electrically insulating layer is arranged between the heat conducting structure and the further outer layer structure. Thereby, the component carrier according to this exemplary embodiment comprises a layered structure with five layers arranged in the following order: outer layer structure (forming e.g. an upper surface of the component carrier), electrically insulating layer, heat conducting structure, further electrically insulating layer, and further outer layer structure (forming e.g. a lower surface of the component carrier).

In this exemplary embodiment, both the outer layer structure and the further outer layer structure receives thermal radiation irradiated by the heat conducting structure and transports heat away by convection as discussed above with regard to the outer layer structure.

The further electrically insulating layer and the further outer layer structure are preferably similar to the electrically insulating layer and the outer layer structure as described in the above exemplary embodiments.

According to a further exemplary embodiment of the invention, the further outer layer structure is further adapted to prevent external thermal radiation impinging onto the further outer layer structure from propagating through the further outer layer structure.

According to a further exemplary embodiment of the invention, the heat conducting structure comprises two separate heat conducting layers separated by an inner layer structure. The inner layer structure comprises (a) a first electrically insulating layer arranged adjacent to one of the two separate heat conducting layers, (b) a first thermal radiation absorbing layer arranged adjacent to the first electrically insulating layer and opposite to the one of the two separate heat conducting layers, (c) an inner heat conducting layer adjacent to the first thermal radiation absorbing layer and opposite to the first electrically insulating layer, (d) a second thermal radiation absorbing layer arranged adjacent to the inner heat conducting layer and opposite to the first thermal radiation absorbing layer, and (e) a second electrically insulating layer arranged adjacent to the second thermal radiation absorbing layer, opposite to the inner heat conducting layer and adjacent to the other one of the two separate heat conducting layers.

In other words, in the present exemplary embodiment, the heat conducting structure comprises two separate heat conducting layers. An inner layer structure is arranged between the two separate heat conducting layers to separate them. The inner layer structure comprises five layers arranged in the following order: first electric insulating layer, first thermal radiation absorbing layer, inner heat conducting layer, second thermal radiation absorbing layer, and second electrically insulating layer.

Thereby, compared to the preceding embodiments, even more absorbing material is provided and the inner heat conducting layer may contribute further to increase the transportation of heat away from the heat conducting structure.

According to a second aspect of the invention, an electronic device is provided. The electronic device comprises (a) a component carrier according to the first aspect or any of the embodiments described above, and (b) at least one heat generating electronic component thermally coupled to the heat conducting structure of the component carrier.

This aspect of the invention is essentially based on the same idea as the first aspect described above and thus provides a compact electronic device capable of providing excellent cooling of its heat generating electronic component(s).

According to a further exemplary embodiment of the invention, the at least one heat generating electronic component is mounted on an outer surface of the component carrier or wherein the at least one heat generating electronic component is embedded within the component carrier.

In other words, the at least one electronic component may be a surface mounted or embedded electronic component.

According to a further exemplary embodiment of the invention, the component carrier comprises or consists of a stack of at least one electrically insulating layer structure and at least one electrically conductive layer structure.

For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

According to a further exemplary embodiment of the invention, at least a part of the heat conducting structure is part of the at least one electrically conductive layer structure.

In other words, at least a part of the electrically conductive layer structure also constitutes at least a part of the heat conducting structure.

According to a further exemplary embodiment of the invention, the at least one electrically insulating layer structure comprises at least one material selected from the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

According to a further exemplary embodiment of the invention, the at least one electrically conductive layer structure comprises at least one of the group consisting of copper, aluminum, and nickel. Although copper is usually preferred, other materials are possible as well.

According to a further exemplary embodiment of the invention, the component carrier is shaped as a plate.

This contributes to the compact design of the electronic device, wherein the component carrier nevertheless provides a large basis for mounting electronic components thereon. Furthermore, in particular a naked die as preferred example for an embedded electronic component, can be conveniently embedded, thanks to its small thickness, into a thin plate such as a printed circuit board.

It should be noted that the component carrier may also assume other geometries depending on the application.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

According to a further exemplary embodiment of the invention, the at least one heat generating electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be embedded in the electronic device. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. Such an electronic component may be surface-mounted on the component carrier and/or may be embedded in an interior thereof. However, other electronic components, in particular those who generate heat, may be mounted on or embedded in the electronic device.

According to a further exemplary embodiment of the invention, the component carrier is a laminate-type component carrier. In such an embodiment, the component carrier is a compound of multiple layer structures which are stacked and connected together by applying a pressing force, if desired accompanied by heat.

According to a third aspect of the invention, a method of manufacturing an electronic device is provided. The method comprises (a) providing an outer layer structure, (b) arranging an electrically insulating layer adjacent to the outer layer structure, (c) arranging a heat conducting structure adjacent to the electrically insulating layer opposite the outer layer structure, (d) providing a heat generating electronic component, and (e) providing a thermal coupling between the heat conducting structure and the heat generating electronic component. The outer layer structure is adapted to receive thermal radiation irradiated by the heat conducting structure and to transport corresponding heat away from the component carrier via convection by a heat transfer medium surrounding the component carrier. The outer layer structure may further be adapted to prevent external thermal radiation impinging onto the outer layer structure from propagating through the outer layer structure.

This aspect provides a method of manufacturing an electronic device according to the second aspect and the embodiments described above, i.e. a compact electronic device with excellent cooling of heat generating electronic components.

According to a further exemplary embodiment of the invention, the method further comprises mounting the heat generating component on an outer surface of the component carrier or embedding the heat generating component within the component carrier.

BRIEF DESCRIPTION OF THE DRAWINGS

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are schematically presented. In different drawings, similar or identical elements are provided with the same reference signs.

Figure 1:
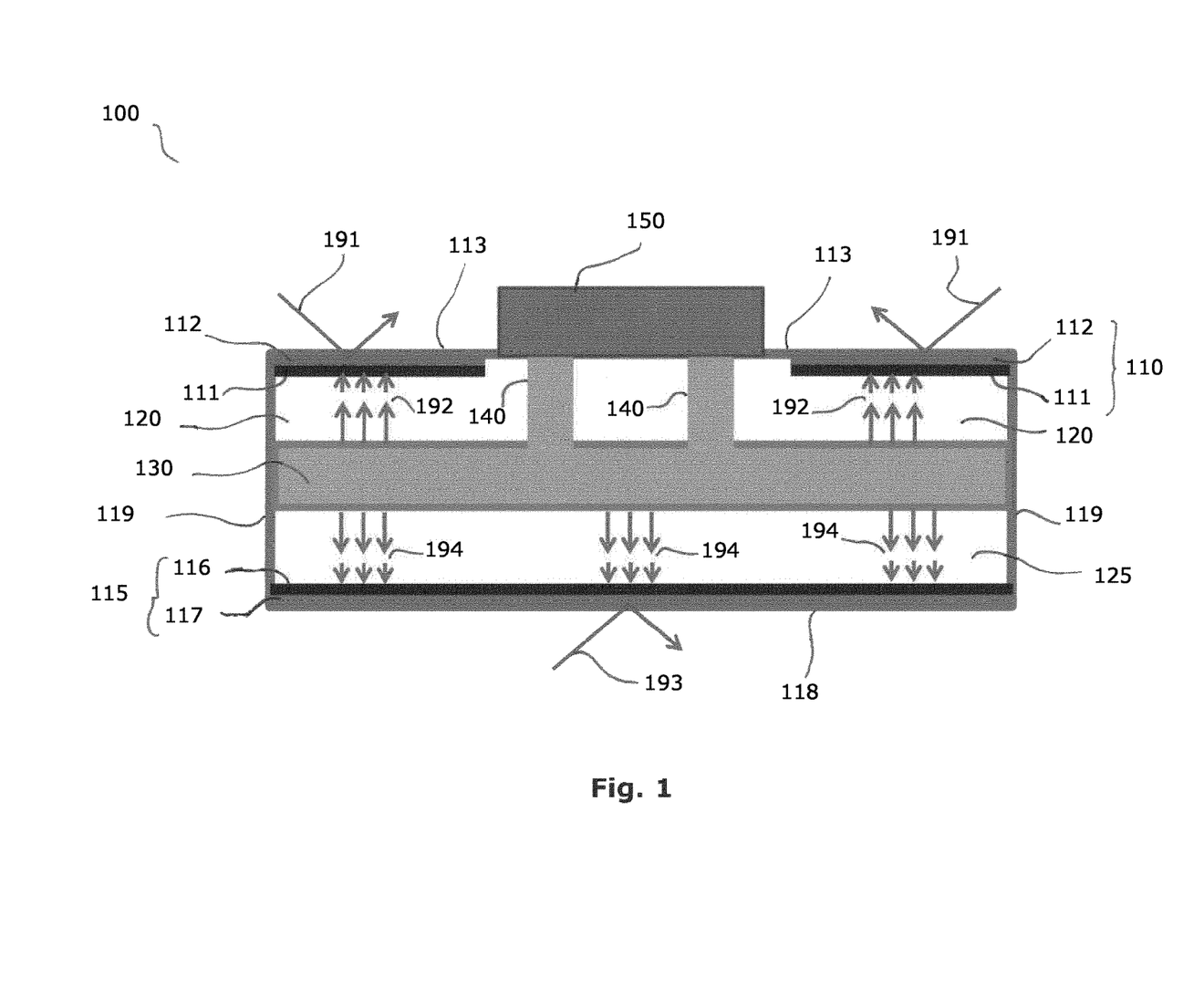
FIG. 1 shows a cross-sectional view of an electronic device according to an embodiment of the present invention.

FIG. 1 shows a cross-sectional view of an electronic device 100 according to an embodiment of the present invention. More specifically, the electronic device 100 comprises a component carrier, such as a printed circuit board (PCB) capable of carrying and cooling an electronic component 150 arranged on a surface of the component carrier. The component carrier comprises outer layer structures 110 and 115, electrically insulating layers 120 and 125, and a heat (and electricity) conducting structure 130 coupled to the electronic component 150 via connecting elements 140.

The upper outer layer structure 110 comprises an IR absorbing layer 111 and an IR reflecting layer 112. The IR absorbing layer is adjacent to the electrically insulating layer 120 and faces the upper side of the heat conducting structure 130 such that it can absorb thermal radiation irradiated by the heat conducting structure 130 as indicated by arrows 192. The IR reflecting layer 112 is adjacent to the IR absorbing layer 111 and opposite to the electrically insulating layer 120. The IR reflecting layer 112 is covered by an outer layer 113 forming the upper surface of the PCB and reflects incoming thermal radiation from external sources, such as sunlight, as indicated by arrows 191.

The lower outer layer structure 115 is similar to the upper outer layer structure 110 but arranged on the opposite side of the heat conducting structure 130 from which it is separated by electrically insulating layer 125. More specifically, the lower outer layer structure 115 comprises an IR absorbing layer 116 and an IR reflecting layer 117. The IR absorbing layer 116 is adjacent to the electrically insulating layer 125 and faces the lower side of the heat conducting structure 130 such that it can absorb thermal radiation irradiated by the heat conducting structure 130 as indicated by arrows 194. The IR reflecting layer 117 is adjacent to the IR absorbing layer 112 and opposite to the electrically insulating layer 125. The IR reflecting layer 117 is covered by outer layer 118 forming the lower surface of the PCB and reflects incoming thermal radiation from external sources, such as sunlight, as indicated by arrow 193.

The electronic device 100 further comprises side surfaces 119 formed of the same material as the outer layers 113 and 118.

The IR absorbing layers 111 and 116 are preferably provided as a coating or film, such as a carbon nanotube/nanodiamond based thin film coating or an ultra-absorbing black coating.

The IR reflecting layers 112 and 117 are preferably provided as a coating or film comprising such materials as Paliogen Black L 0086, Sicopal Black L 0095, Xfast Black 0095, Luconyl NG Black 0095, a semiconductor film comprising PbS or a semiconductor film comprising PbSe.

The electrically insulating layers 120 and 125 are preferably made of IR transparent FR-4 which is thermally insulating.

The heat conducting structure 130 is preferably part of or coincident with an electrically conducting structure and comprises a thermally and electrically conducting material, such as copper. The upper and lower surface of the heat conducting structure are treated or coated in order to provide a high emissivity of thermal radiation, i.e. $\varepsilon \geq 0.7$.

During operation, the electronic component 150 will generate heat which, at least in part, is transmitted to the heat conducting structure 130 via the connecting elements 140. This will cause the temperature of the heat conducting structure 130 to rise until saturation is reached. Thermal energy in form of thermal radiation, i.e. infrared light, is then irradiated from the surface of the heat conducting structure. The thermal radiation propagates through the electrically insulating layers 120 and 125 and impinges onto the respective IR absorbing layers 111 and 116 of the outer layer structures 110 and 115 where it is absorbed. Thereby, the temperature of the outer layer structures 110 and 115, in particular the outer surface layers 113 and 118 increases and the heat is transported away from the electronic device using convection, i.e. by the surrounding air. As a result, the heat generated by the electronic component is effectively transported away such that an efficient cooling is provided.

The same efficiency would not be obtainable by thermal radiation from conductive traces on the surface of a standard PCB. In particular, such traces are usually made from blank copper which has an emissivity of around 0.02. By using an internal electrically conducting structure with a high emissivity and the combination of IR absorbing layers 111 and 116 and IR reflecting layers 112 and 117, a very effective transport of thermal energy away from the electronic device 100 can be provided.

Figure 2:
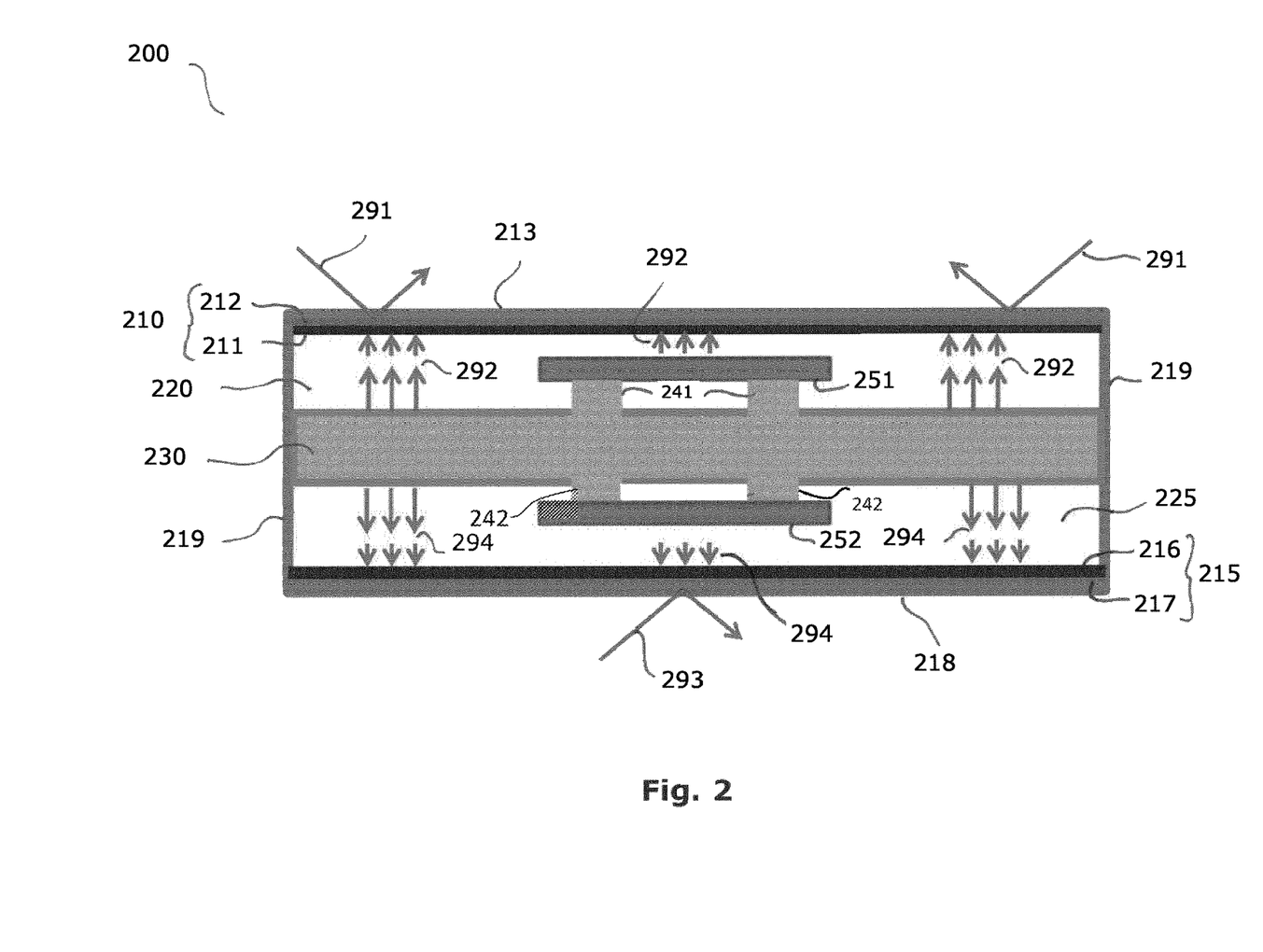
FIG. 2 shows a cross-sectional view of an electronic device according to a further embodiment of the present invention.

FIG. 2 shows a cross-sectional view of an electronic device 200 according to a further embodiment of the present invention. The electronic device 200 builds on the same principles as the electronic device 100 discussed above and differs only in that it comprises two embedded heat generating electronic components 251 and 252 (instead of the surface mounted single electronic component 150 shown in FIG. 1). Accordingly, as can be seen from the drawings, the electronic device 200 comprises upper and lower outer layer structures 210 and 215 similar to the corresponding structures 110 and 115 of FIG. 1, upper and lower electrically insulating layers 220 and 225 similar to the corresponding layers 120 and 125 of FIG. 1, and a heat conducting structure 230 similar to the structure 130 of FIG. 1. The electronic device 200 further comprises an upper electronic component 251 and a lower electronic component 252 respectively coupled to the heat conducting structure 230 via connecting elements 241 and 242 and embedded within the component carrier.

Except for the fact that the embedded components 251 and 252 cannot transfer any heat directly to the surrounding air, the cooling function works in the same way in this embodiment as in the embodiment shown in FIG. 1. That is, heat is transmitted from the electronic components 251 and 252 to the heat conducting structure 230 via the respective connecting elements 241 and 242. This will cause the temperature of the heat conducting structure 230 to rise until saturation is reached. Thermal energy in form of thermal radiation, i.e. infrared light, is then irradiated from the surface of the heat conducting structure 230. The thermal radiation propagates through the electrically insulating layers 220 and 225 and impinges onto the respective IR absorbing layers 211 and 216 of the outer layer structures 210 and 215, where it is absorbed. Thereby, the temperature of the outer layer structures 210 and 215, in particular the outer surface layers 213 and 218 increases and the heat is transported away from the electronic device using convection, i.e. by the surrounding air. As a result, the heat generated by the electronic component is effectively transported away such that an efficient cooling is provided.

In sum, a simple and highly compact electronic device 200 with excellent cooling of embedded electronic components is provided.

Figure 3:
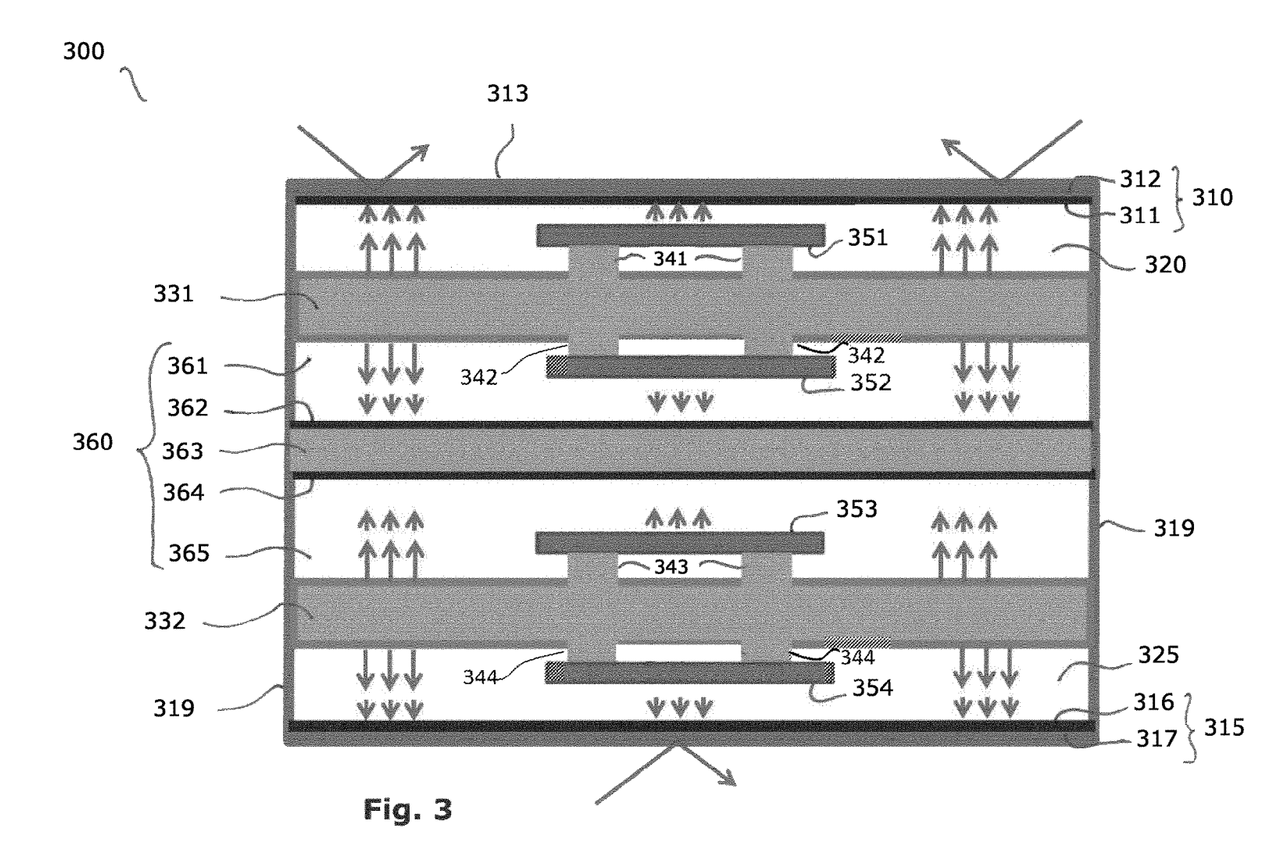
FIG. 3 shows a cross-sectional view of an electronic device according to a further embodiment of the present invention.

FIG. 3 shows a cross-sectional view of an electronic device 300 according to a further embodiment of the present invention. The working principle of the electronic device 300 is similar to that of the electronic device 200 shown in FIG. 2 and discussed above. The electronic device 300 differs from the electronic device 200 in that it comprises two heat conducting layers 331 and 332 forming a heat conducting structure. An embedded electronic component 351 and 352 is provided on each side of heat conducting layer 331 and an embedded electronic component 353 and 354 is provided on each side of heat conducting layer 352. The two heat conducting layers 331 and 332 are separated by a layered structure 360 comprising a first electrically insulating layer 361, a first IR absorbing layer 362, an inner heat conducting layer 363, a second IR absorbing layer 364, and a second electrically insulating layer 365.

In operation, heat is conducted from the electronic components 351 and 352 via the respective connecting elements 342 and 342 to the first heat conducting layer 331. This causes the first heat conducting layer 331 to irradiate thermal radiation towards the IR absorbing layer 311 of the outer layer structure 310 and towards the first IR absorbing layer 362 of the inner layer structure 360. Similarly, heat is conducted from the electronic components 353 and 354 via the respective connecting elements 343 and 344 to the second heat conducting layer 332. This causes the second heat conducting layer 332 to irradiate thermal radiation towards the IR absorbing layer 316 of the outer layer structure 315 and towards the second IR absorbing layer 364 of the inner layer structure 360.

The outer layer structures 310 and 315 function in the same way as described above in conjunction with the embodiments of FIGS. 1 and 2. The thermal energy absorbed by the first IR absorbing layer 362 and second IR absorbing layer 364 of the inner layer structure is transferred as heat to the inner heat conducting layer 363 which consequently heats up. In some embodiments, additional measures may be taken to transfer this heat away, e.g. using convection. However, in the specific embodiment shown in FIG. 3, the layer 363 can serve simply as a heat capacitor and store heat during operation or be physically connected to the system to transport heat via diffusion.

In sum, efficient cooling of several embedded electronic components is provided in a simple and compact package.

Figure 4:
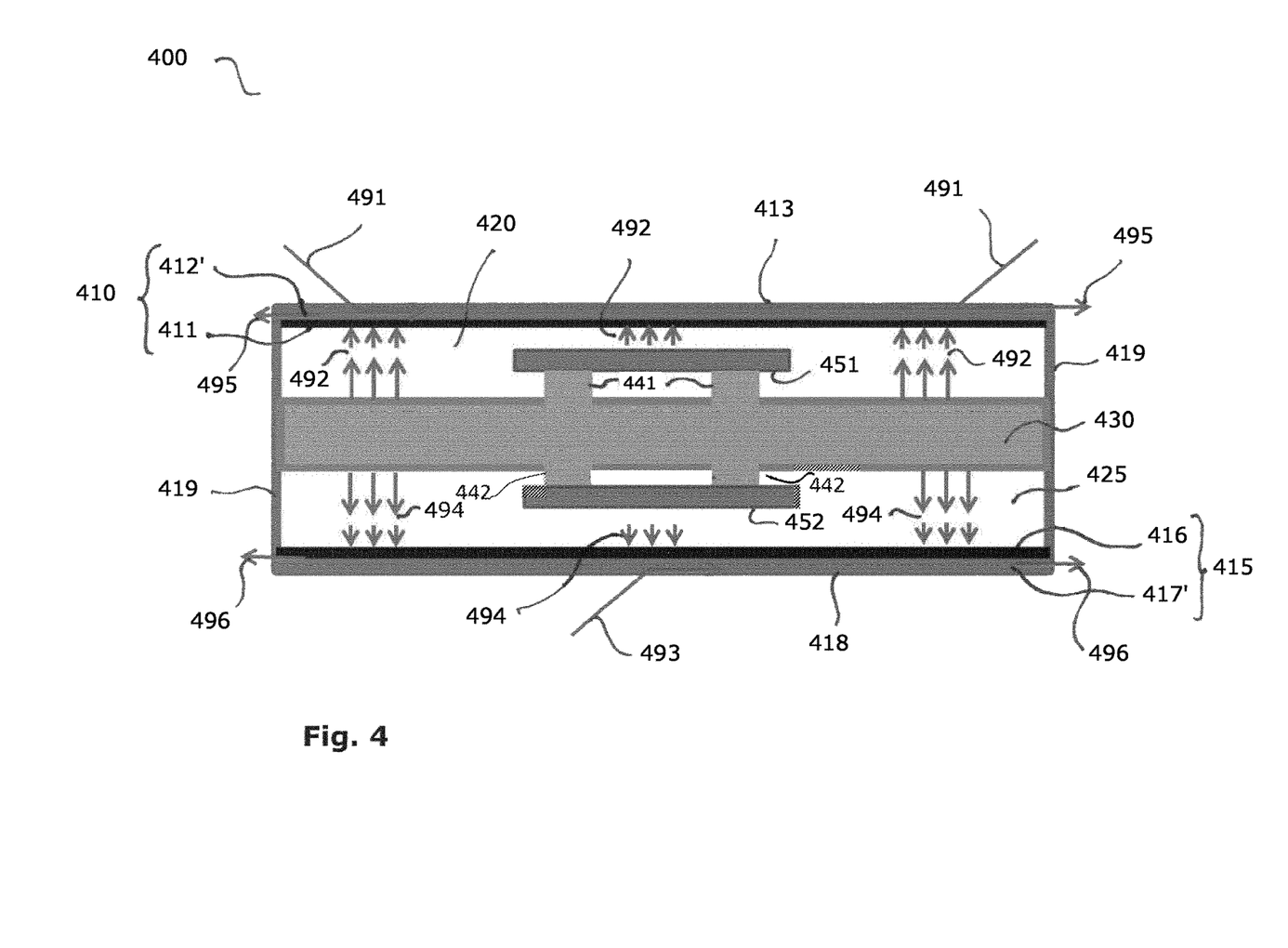
FIG. 4 shows a cross-sectional view of an electronic device according to a further embodiment of the present invention.

FIG. 4 shows a cross-sectional view of an electronic device 400 according to a further embodiment of the present invention. The electronic device 400 is similar to the electronic device 200 shown in FIG. 2 and discussed above, and differs therefrom only in the construction of the upper outer layer structure 410 and lower outer layer structure 415.

More specifically, the upper outer layer structure 410 comprises an IR absorbing layer 411 (similar to IR absorbing layer 211 of the electronic device 200) and a waveguide layer 412' adapted to deflect incoming external thermal radiation and guide it (as indicated by arrows 491) towards the edges (left and right hand sides in the drawing) of the waveguide layer 412' where it leaves the structure (as indicated by arrows 495). Similarly, the lower outer layer structure 415 comprises an IR absorbing layer 416 (similar to IR absorbing layer 216 of the electronic device 200) and a waveguide layer 417' adapted to deflect incoming external thermal radiation and guide it (as indicated by arrow 493) towards the edges (left and right hand sides in the drawing) of the waveguide layer 417' where it leaves the structure (as indicated by arrows 496). In this embodiment, the waveguide layers 412' and 417' are formed by photonic crystals.

The electronic device 400 discussed above may be further modified by replacing the IR absorbing layers 411 and 416 by waveguide layers similar to the above discussed waveguide layers 412' and 417'. Thereby, the thermal radiation irradiated by the heat conducting structure 430 is not absorbed but instead deflected and guided towards the edges of the corresponding waveguide layers. Preferably, a single waveguide structure comprising photonic crystals may constitute each of the outer layer structures 410 and 415, i.e. the layers 411 and 412' in FIG. 4 may be replaced by a single waveguide layer and the layers 416 and 417' in FIG. 4 may be replaced by another single waveguide layer.

It is explicitly stated that although the detailed embodiments shown in FIGS. 1 to 4 and discussed in detail above all comprise at least one outer layer 112, 117, 212, 217, 312, 317, 412', 417' adapted to prevent thermal radiation from propagating through the outer layer structure (by reflection or deflection), these outer layers are optional and need only be included for applications where the electronic device will be exposed to significant amounts of external thermal radiation. For other applications, such as in devices for subsea or space applications, the reflecting/deflecting layers may be left out in order to keep cost down.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A component carrier for carrying and cooling at least one heat generating electronic component, the component carrier comprising:
    an outer layer structure,
    an electrically insulating layer arranged adjacent to the outer layer structure, and
    a heat conducting structure arranged adjacent to the electrically insulating layer on a side opposite to the outer layer structure, the heat conducting structure being adapted to be thermally coupled to the at least one heat generating electronic component,
    wherein the outer layer structure is adapted to receive thermal radiation irradiated by the heat conducting structure and to transport corresponding heat away from the component carrier via convection by a heat transfer medium surrounding the component carrier,
    wherein the outer layer structure comprises a first layer arranged adjacent to the electrically insulating layer,
    wherein the outer layer structure is further adapted to prevent external thermal radiation impinging onto the outer layer structure from propagating through the outer layer structure,
    wherein the outer layer structure further comprises a second layer adapted to prevent thermal radiation from propagating through the outer layer structure by reflecting thermal radiation.

2. The component carrier according to claim 1, wherein the first layer is adapted to absorb thermal radiation.

3. The component carrier according to claim 1, wherein the first layer comprises an infrared light absorbing material.

4. The component carrier according to claim 3, wherein the infrared light absorbing material is selected from the group consisting of a carbon nanotube/nanodiamond based thin film coating or an ultra-absorbing black coating.

5. The component carrier according to claim 1, wherein the first layer is adapted to deflect thermal radiation irradiated by the heat conducting structure in a predetermined direction.

6. The component carrier according to claim 5, wherein the first layer comprises a waveguide structure adapted to guide the deflected thermal radiation away from the outer layer structure.

7. The component carrier according to claim 1, wherein the second layer comprises an infrared light reflecting material selected from the group consisting of Paliogen Black L 0086, Sicopal Black L 0095, Xfast Black 0095, Luconyl NG Black 0095, a semiconductor film comprising PbS, and a semiconductor film comprising PbSe.

8. The component carrier according to claim 1, wherein the second layer is adapted to deflect external thermal radiation impinging onto the outer layer structure in a predetermined direction.

9. The component carrier according to claim 8, wherein the second layer comprises a waveguide structure adapted to guide the deflected thermal radiation away from the outer layer structure.

10. The component carrier according to claim 1, wherein the electrically insulating layer comprises an electrically and thermally insulating material which is transparent to infrared light.

11. The component carrier according to claim 1, wherein the heat conducting structure comprises a material having an emissivity equal to or larger than 0.7, wherein the heat conducting structure comprises a material selected from the group consisting of cuprous oxide, rough copper, and vanadium dioxide.

12. The component carrier according to claim 1, further comprising:
    a further electrically insulating layer arranged on a side of the heat conducting structure opposite to the electrically insulating layer, and
    a further outer layer structure arranged adjacent the further electrically insulating layer on a side opposite to the heat conducting structure,
    wherein the further outer layer structure is adapted to receive thermal radiation irradiated by the heat conducting structure and to transport corresponding heat away from the component carrier via convection by a heat transfer medium surrounding the component carrier.

13. The component carrier according to claim 12, wherein the further outer layer structure is adapted to prevent external thermal radiation impinging onto the further outer layer structure from propagating through the further outer layer structure.

14. The component carrier according to claim 12, wherein the heat conducting structure comprises two separate heat conducting layers separated by an inner layer structure, the inner layer structure comprising:
    a first electrically insulating layer arranged adjacent to one of the two separate heat conducting layers,
    a first thermal radiation absorbing layer arranged adjacent to the first electrically insulating layer and opposite to the one of the two separate heat conducting layers,
    an inner heat conducting layer adjacent to the first thermal radiation absorbing layer and opposite to the first electrically insulating layer,
    a second thermal radiation absorbing layer arranged adjacent to the inner heat conducting layer and opposite to the first thermal radiation absorbing layer, and
    a second electrically insulating layer arranged adjacent to the second thermal radiation absorbing layer, opposite to the inner heat conducting layer and adjacent to the other one of the two separate heat conducting layers.

15. A component carrier for carrying and cooling at least one heat generating electronic component, the component carrier comprising:
    an outer layer structure;
    an electrically insulating layer arranged adjacent to the outer layer structure;
    a heat conducting structure arranged adjacent to the electrically insulating layer on a side opposite to the outer layer structure, the heat conducting structure being adapted to be thermally coupled to the at least one heat generating electronic component;

wherein the outer layer structure is adapted to receive thermal radiation irradiated by the heat conducting structure and to transport corresponding heat away from the component carrier via convection by a heat transfer medium surrounding the component carrier; and a further electrically insulating layer arranged on a side of the heat conducting structure opposite to the electrically insulating layer, and a further outer layer structure arranged adjacent the further electrically insulating layer on a side opposite to the heat conducting structure;

wherein the further outer layer structure is adapted to prevent external thermal radiation impinging onto the further outer layer structure from propagating through the further outer layer structure.

16. The component carrier of claim 15, wherein the at least one heat generating electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

17. The component carrier of claim 15, further comprising at least one of the following features:
the component carrier comprises or consists of a stack of at least one electrically insulating layer structure and at least one electrically conductive layer structure;
at least a part of the heat conducting structure is part of the at least one electrically conductive layer structure;
the at least one electrically insulating layer structure comprises at least one material selected from the group consisting of resin, Bismaleimide-Triazine resin, cyanate ester, glass, glass fibers, prepreg material, polyimide, liquid crystal polymer, epoxy-based Build-Up Film, FR4 material, a ceramic, and a metal oxide;
the at least one electrically conductive layer structure comprises at least one of the group consisting of copper, aluminum, and nickel;
the component carrier is shaped as a plate;
the component carrier is a laminate-type component carrier.

18. A component carrier for carrying and cooling at least one heat generating electronic component, the component carrier comprising:

an outer layer structure;
an electrically insulating layer arranged adjacent to the outer layer structure; and
a heat conducting structure arranged adjacent to the electrically insulating layer on a side opposite to the outer layer structure, the heat conducting structure being adapted to be thermally coupled to the at least one heat generating electronic component;
wherein the outer layer structure is adapted to receive thermal radiation irradiated by the heat conducting structure and to transport corresponding heat away from the component carrier via convection by a heat transfer medium surrounding the component carrier;
wherein the outer layer structure comprises a first layer arranged adjacent to the electrically insulating layer; and
the first layer is adapted to absorb thermal radiation.

19. The component carrier of claim 18, wherein the at least one heat generating electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, and a logic chip.

20. The component carrier of claim 18, further comprising at least one of the following features:
the component carrier comprises or consists of a stack of at least one electrically insulating layer structure and at least one electrically conductive layer structure;
at least a part of the heat conducting structure is part of the at least one electrically conductive layer structure;
the at least one electrically insulating layer structure comprises at least one material selected from the group consisting of resin, Bismaleimide-Triazine resin, cyanate ester, glass, glass fibers, prepreg material, polyimide, liquid crystal polymer, epoxy-based Build-Up Film, FR4 material, a ceramic, and a metal oxide;
the at least one electrically conductive layer structure comprises at least one of the group consisting of copper, aluminum, and nickel;
the component carrier is shaped as a plate;
the component carrier is a laminate-type component carrier.

* * * * *